United States Patent
Ivey et al.

(10) Patent No.: US 9,693,478 B2
(45) Date of Patent: Jun. 27, 2017

(54) WALL-MOUNTED ARTICULATING HALF RACK CABINET SYSTEM

(71) Applicant: Atlas Sound LP, Ennis, TX (US)

(72) Inventors: Johnathan Loyd Ivey, Chandler, AZ (US); Kenneth Wade Chappell, Midlothian, TX (US); Kevin Sykes, Phoenix, AZ (US)

(73) Assignee: Atlas Sound LP, Ennis, TX (US)

( * ) Notice: Subject to any disclaimer, the term of this patent is extended or adjusted under 35 U.S.C. 154(b) by 587 days.

(21) Appl. No.: 13/933,900

(22) Filed: Jul. 2, 2013

(65) Prior Publication Data

US 2015/0008810 A1    Jan. 8, 2015

(51) Int. Cl.
| A47F 5/08 | (2006.01) |
| A47B 67/02 | (2006.01) |
| H05K 7/16 | (2006.01) |
| A47B 46/00 | (2006.01) |
| A47B 96/07 | (2006.01) |
| H05K 5/02 | (2006.01) |

(52) U.S. Cl.
CPC ............. *H05K 7/16* (2013.01); *A47B 46/005* (2013.01); *A47B 96/07* (2013.01); *H05K 5/0204* (2013.01)

(58) Field of Classification Search
CPC ..... A47B 83/045; A47B 96/07; A47B 46/005; A47B 77/10; A47B 5/00; A47B 5/006; A47B 5/04; A47C 17/52; E05D 3/14; E05D 3/186; H05K 5/0204; H05K 7/16; H04M 1/022
USPC .............................. 312/245–248; 108/42, 48
See application file for complete search history.

(56) References Cited

U.S. PATENT DOCUMENTS

| 1,341,654 A | * | 6/1920 | Lincoln | A47B 5/04 |
| | | | | 211/99 |
| 1,515,242 A | * | 11/1924 | Dexter | A47B 5/04 |
| | | | | 108/134 |
| 4,783,131 A | * | 11/1988 | Grass | E05D 15/44 |
| | | | | 312/276 |

(Continued)

FOREIGN PATENT DOCUMENTS

| DE | 812932 C | * | 9/1951 | ............... H05K 7/16 |
| DE | 1779020 A1 | * | 4/1972 | |

OTHER PUBLICATIONS

Displays2go.com; LCD Wall Bracket, www.displays2go.com/P-I2828/LCD-Wall-Bracket with TIIting-Mount?o=1-26462; Jul. 2, 2013; Bristol, RI.

(Continued)

*Primary Examiner* — Daniel J Troy
*Assistant Examiner* — Andres F Gallego
(74) *Attorney, Agent, or Firm* — Keith L. Jenkins, Registered Patent Attorney, LLC; Keith L. Jenkins

(57) ABSTRACT

A half-rack electronics cabinet coupled to a wall mount by two doubly-nested four bar mechanisms that are operable to articulate the cabinet by ninety degrees to bring the back planes of any installed electronic modules to the top for easy access. The function of admitting outside signal and power cables is apportioned to the wall mount. The unit is compact, as the wall mount is no wider than the cabinet. For a half-rack cabinet of sufficient height, crossbars are provided that enable vertical mounting of full-rack electronic modules in the half-rack cabinet along with, preferably, at least one half-rack module.

20 Claims, 12 Drawing Sheets

(56) References Cited

U.S. PATENT DOCUMENTS

| | | | | | |
|---|---|---|---|---|---|
| 4,998,484 | A | * | 3/1991 | Groetzinger | 108/42 |
| 5,542,549 | A | * | 8/1996 | Siemon | H04Q 1/06 211/189 |
| 5,655,459 | A | * | 8/1997 | O'Connor | A47C 9/06 108/134 |
| 5,664,290 | A | * | 9/1997 | Scherrer | E05D 3/06 16/287 |
| 6,467,640 | B1 | * | 10/2002 | Hung | E05D 7/1011 174/50 |
| 6,906,925 | B2 | * | 6/2005 | Robbins | H01R 25/006 312/322 |
| 2005/0179348 | A1 | * | 8/2005 | Caveney et al. | 312/248 |
| 2007/0236114 | A1 | * | 10/2007 | Fuentes | A47B 46/005 312/246 |
| 2009/0086463 | A1 | * | 4/2009 | Caveney | H01R 9/2416 361/826 |
| 2011/0235249 | A1 | * | 9/2011 | Bustle | A47B 21/0314 361/679.01 |
| 2012/0018389 | A1 | * | 1/2012 | Fan | H05K 7/1489 211/26 |
| 2014/0027392 | A1 | * | 1/2014 | Crippen | H05K 7/1488 211/26 |

OTHER PUBLICATIONS

Middle Atlantic Power Products; DWR Wall Racks; www.middleatlantic.com/enclosures/wall/dwr.htm; Jul. 2, 2013.

cableorganizer.com; Wall Mount Server Racks; www.cableorganizer.com/computer-cabinets/wall-mount-cabinets.htm; Jul. 2, 2013.

* cited by examiner

WALL-MOUNTED ARTICULATING HALF RACK CABINET SYSTEM

TECHNICAL FIELD

This invention relates to providing an electronic module-mounting cabinet (hereinafter "cabinet") for installing electronic modules, or components, that accommodates modules that are half the width of traditional full-rack modules, is wall mounted with an articulating doubly-nested four-bar mechanism that rotates the cabinet to allow access to the back planes of the mounted components.

BACKGROUND

Many electronic applications can be created with combinations of electronic modules connected together, and it is convenient to have all the modules for a particular purpose supported in a single structure. A common example is a household stereo component system, which might include a radio receiver, various media players, content storage, and an amplifier. A more modern example would be a server farm. Electronic modules conventionally have signal and power couplings on the rear wall, or "back plane" of the module and controls and visual displays on the front wall, or "front plane", of the module.

The basic structure for supporting a plurality of electronic modules is a rack. Racks come in a variety of standard sizes to accommodate correspondingly-sized electronic modules. The standard sizes for racks and components are established by various industry organizations. A rack with side, top, and rear panels is referred to as a cabinet. As the size of electronic devices has shrunk, smaller modules and racks have entered the market. In particular, half-racks, which are half-width racks as compared to an established standard for racks, are of concern in this application.

Recurring challenges in half-rack cabinet technology are to provide a compact package which still provides ease of access to the back planes of the modules for managing interconnections, security for those back plane connections when not being worked on by authorized personnel, minimizing floor space used, visibility for the front planes, and economy of design. Various approaches have been taken to meeting these challenges, among which the approach taken in the present invention is novel. Another challenge, not previously recognized or taken up by others, is how to mix half-rack modules and full-rack modules in a half-rack cabinet.

Therefore, a need exists for a half-rack cabinet that can be wall mounted. In addition, there is a need for a half-rack cabinet that provides easy access to the module back planes. In addition, there is a need for a half-rack cabinet that provides security for back-plane connections. In addition, there is a need for a half-rack cabinet that provides for mixing half-rack modules and full rack modules in the same half-rack cabinet.

OBJECTS AND FEATURES OF THE INVENTION

A primary object and feature of the present invention is to overcome the above-mentioned problems and fulfill the above-mentioned needs.

Another object and feature of the present invention is to provide a half-rack cabinet that provides a wall mount. It is a further object and feature of the present invention to provide a half-rack cabinet that provides easy access to the module back planes. It is a further object and feature of the present invention to provide a half-rack cabinet that provides security for back-plane connections. In addition, there is a need for a half-rack cabinet that provides for mixing half-rack modules and full rack modules in the same half-rack cabinet.

It is an additional primary object and feature of the present invention to provide such a system that is efficient, inexpensive and handy. Other objects and features of this invention will become apparent with reference to the following descriptions.

SUMMARY OF THE INVENTION

A half-rack cabinet with a lockable and articulatible wall mounting that is tall enough to accommodate a plurality of half-rack modules in a normal horizontal mounting position and a plurality of full-rack modules mounted vertically using crossbars. The articulation is via two opposed parallel vertically oriented doubly nested four-bar mechanisms using wall mount channels and cabinet channels as two of the bars for each four-bar mechanism. In the closed position, the cabinet channels nest within corresponding wall mount channels and the remaining two bars of the four-bar mechanism nest with the cabinet channels, with the result that the wall mount and articulating mechanism do not exceed the width or top of the cabinet. Fully articulated, the cabinet is rotated ninety degrees, putting the back panels of the modules on top. A front door is optional. Such a cabinet, that has more than nineteen inches internal height for accommodating electronic modules, is further equipped with cross bars for vertically mounting full rack modules in a half-rack cabinet.

BRIEF DESCRIPTION OF THE DRAWINGS

The present invention will hereinafter be described in conjunction with the following drawing figures, wherein like numerals denote like elements.

DETAILED DESCRIPTION OF THE PRESENT INVENTION

Words of orientation, such as right, left, top, bottom, front, rear, etc., as used herein, are based on the device being in operational orientation and seen from the point of view of a person looking at the device from the front.

Figure 1:
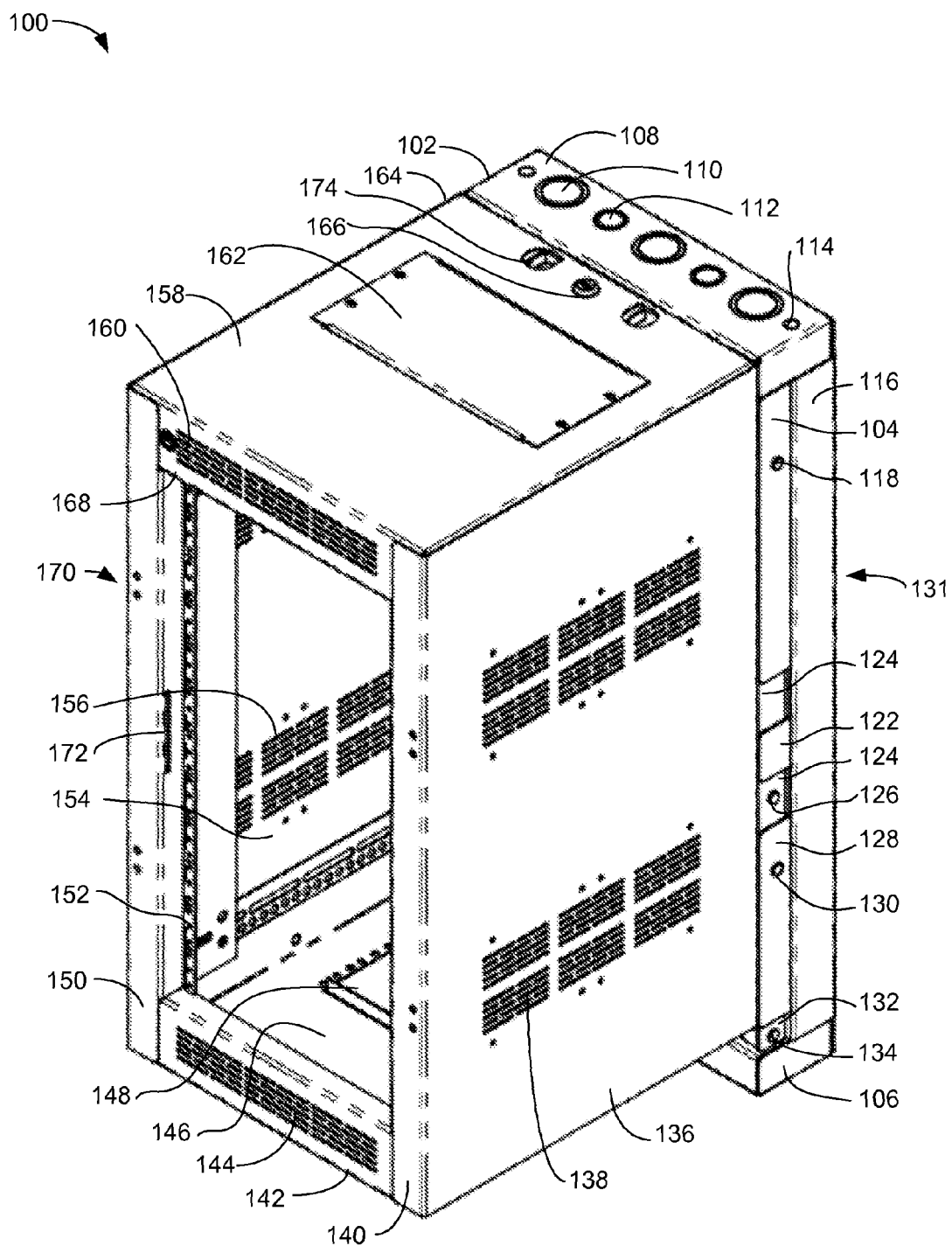
FIG. 1 is a top side perspective view illustrating a first exemplary embodiment of the wall-mounted articulating half-rack cabinet system in a closed configuration, according to a preferred embodiment of the present invention.

FIG. 1 is a top side perspective view illustrating a first exemplary embodiment of the wall-mounted articulating half-rack cabinet system 100 in a closed configuration, according to a preferred embodiment of the present invention. Wall-mounted articulating half-rack cabinet system 100 includes wall mount 102 and cabinet 164. Wall mount 102 includes top mounting panel 108 that features a plurality of large cable knockouts 110 (one of three labeled) and a plurality of smaller cable knockouts 112 (one of two labeled). Fastener openings 114 (one of two labeled) assist in the construction of the cabinet 164. Right mounting side panel 116 extends from top mounting panel 108 to bottom mounting panel 106, which is similar to top mounting panel 108, except for orientation. Wall-mount 102 and half-rack cabinet 164 are preferably made of steel. In various additional embodiments, other materials with similar properties may be used.

Right mounting channel 131 is a first bar of the right-hand four-bar mechanism and is fixed to an inwardly bent extension 294 (see FIG. 2) of right mounting side panel 116. Right mounting channel 131 includes top right mounting panel channel outer flange 104, middle right mounting panel channel outer flange 122, and bottom right mounting panel channel outer flange 128, as well as parts that will become visible only in later illustrations. Top right mounting panel channel outer flange 104 assists in supporting right top bar top pivot 118. Bottom right mounting panel channel outer flange 128 assists in supporting right bottom bar top pivot 130. Right cabinet channel top outer flange 124 nests within right mounting channel 131 and assists in supporting right top bar bottom pivot 126. Right cabinet channel bottom outer flange 132 nests within right mounting channel 131, extends partially below right mounting channel 131, and assists in supporting right bottom bar bottom pivot 134. Right cabinet channel top outer flange 124 and right cabinet channel bottom outer flange 132 are part of right cabinet channel 235 (see FIG. 2), which is a third bar of the four-bar mechanism which will be discussed in more detail below.

Cabinet 164 includes top cabinet panel 158, right side cabinet panel 136, left side cabinet panel 154, bottom cabinet panel 146, and a cabinet front that includes right front cabinet panel 140, left front cabinet panel 150, bottom front cabinet panel 142, and top front cabinet panel 168. Top cabinet panel 158 supports releasably attached top access panel 162, lock 166, and lock release tabs 174 (one of two labeled). Right side cabinet panel 136 includes ventilation gratings 138 (one of twelve labeled). Left side cabinet panel 154 is a mirror image of right side cabinet panel 136 and has ventilation gratings 156 (one of eight visible labeled).

Left vertical attachment strip 152, offset rearward from the front surface of half-rack cabinet 164, and so internal to the half-rack cabinet 164, has spaced-apart holes 1260 (see FIG. 12) for receiving fasteners for attaching electronic modules. Right vertical attachment strip 604 (see FIG. 6) is aligned with left vertical attachment strip 152 to receive electronic modules with standard fastening holes.

Right front cabinet panel 140 is preferably a bent extension of right side panel, as shown. Left front cabinet panel 150 is preferably a bent extension of left side cabinet panel 154, as shown. Left front cabinet panel 150 illustrates hinge fastening holes 170 (one of four pairs labeled) and door latch 172 for an optional door. Bottom front cabinet panel 142 is preferably a bent extension of bottom cabinet panel 146, as shown. Bottom front cabinet panel 142 includes a ventilation grating 144. Top front cabinet panel 168 is preferably a bent extension of top cabinet panel 158, as shown. Top front cabinet panel 168 includes a ventilation grating 160. Half-rack cabinet 164 makes a zero-degree angle to wall mount 102 in the configuration shown in FIG. 1. The zero-degree angle configuration is also referred to as the "closed" configuration.

Figure 2:
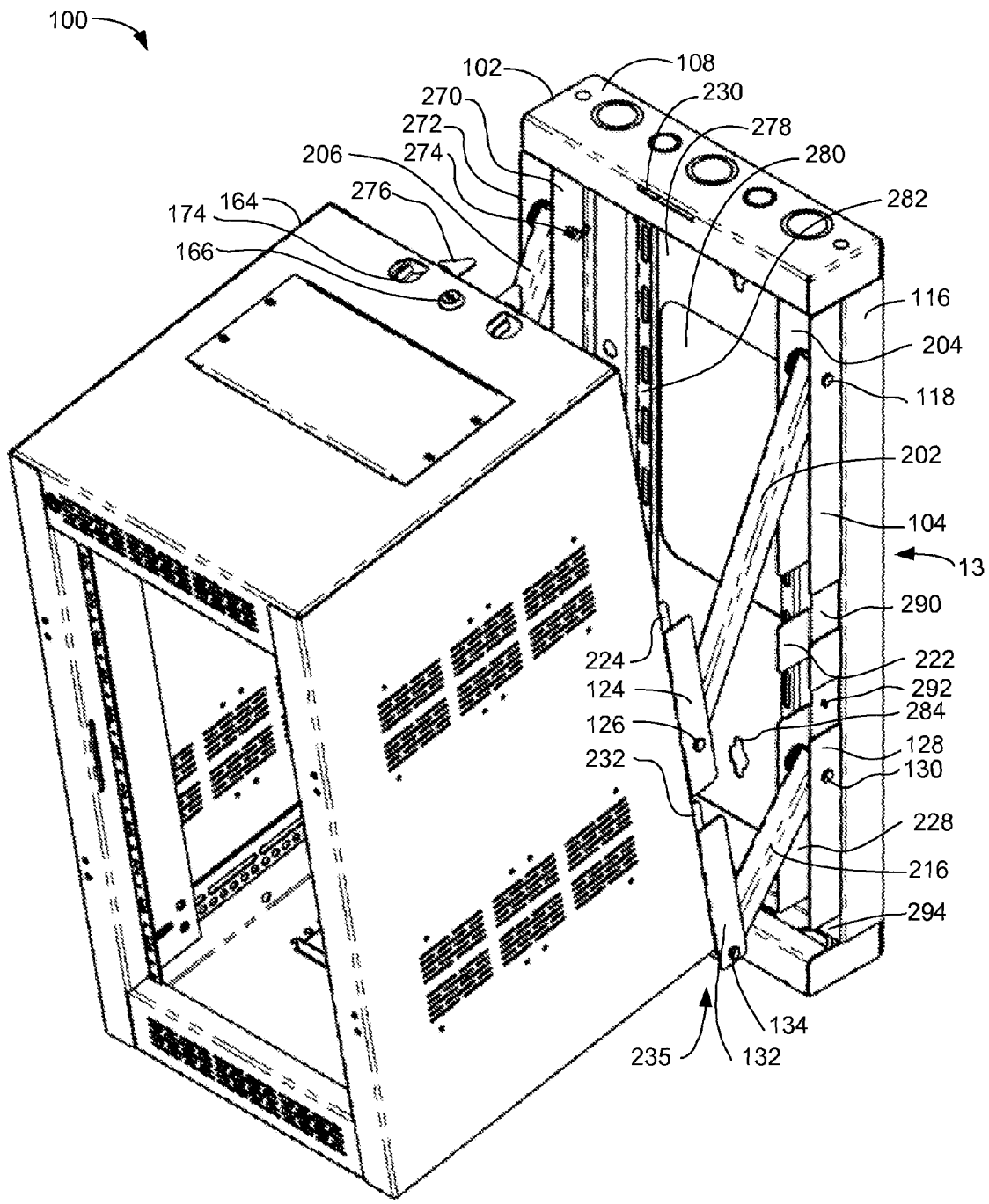
FIG. 2 is a top side perspective view illustrating the first exemplary embodiment of the wall-mounted articulating half-rack cabinet system of FIG. 1 in a partially (ten degrees) open configuration, according to a preferred embodiment of the present invention.

FIG. 2 is a top side perspective view illustrating the first exemplary embodiment of the wall-mounted articulating half-rack cabinet system 100 of FIG. 1 in a partially (ten degrees) open configuration, according to a preferred embodiment of the present invention. Right mounting channel 131 can be seen to include top right mounting panel channel outer flange 104, top right mounting panel channel inner flange 204, middle right mounting panel channel outer flange 122, middle right mounting panel channel inner flange 222, bottom right mounting panel channel outer flange 128, bottom right mounting panel channel inner flange 228, and right mounting panel channel base 290. Right mounting panel channel base 290 extends from the top edge of top right mounting panel channel outer flange 104 to the bottom edge of bottom right mounting panel channel outer flange 128 and is on one piece with top right mounting panel channel outer flange 104, top right mounting panel channel inner flange 204, middle right mounting panel channel outer flange 122, middle right mounting panel channel inner flange 222, bottom right mounting panel channel outer flange 128, and bottom right mounting panel channel inner flange 228. Right mounting channel 131 is fastened to a bent extension 294 of right mounting side panel 116 using a plurality of fasteners 292 (one visible in this view) through right mounting panel channel base 290.

Right cabinet channel 235 is a third bar of the right-hand four bar mechanism and includes right cabinet channel top outer flange 124, right cabinet channel top inner flange 224, right cabinet channel bottom outer flange 132, right cabinet channel bottom inner flange 232, and right cabinet channel base 492 (see FIG. 4), all of which are of one piece.

Top right bar 202 is the second bar of the right four bar mechanism 131, 202, 235, 216 and is pivotably coupled at opposed ends to top right bar top pivot 118 and right top bar bottom pivot 126. Bottom right bar 216 is the fourth bar of the right four bar mechanism 131, 202, 235, 216 and is pivotably coupled at opposed ends to bottom right bar top pivot 130 and right bottom bar bottom pivot 134. Top right bar 202 and bottom right bar 216 nests within right cabinet channel 235 which, in turn, nests in right mounting channel 131, all in the closed position. Accordingly, the right four bar mechanism 131, 202, 235, 216 is doubly nested.

Top left mounting panel channel outer flange 272 and top left mounting panel channel inner flange 270 support left top bar top pivot 274 which pivotally couples left top bar 206, which is part of the left-hand four bar mechanism to be discussed further below. Right and left four bar mechanisms are parallel, spaced apart, and similarly dimensioned. As a result, they act in unison.

Wall mount back panel 278 extends from the rear edge of right mounting side panel 116 to cover the rear of wall mount 102. Preferably, wall mount back panel 278 is of one piece with right mounting side panel 116 and its mirror image on the left side (not visible in this view). Back panel has an outlet opening 280 and a plurality of double-key-hole openings 284 (one of two visible of six present (See FIG. 10) labeled). Left wall mount cable tie support 282 is at least partially accessible from the rear through outlet opening 280.

Top mounting panel 108 includes a slot 230 for receiving outwardly biased prongs 276 (one of two labeled). Prongs 276 are compressed inward by manual operation of lock release tabs 174 (one of two labeled). Lock 166 prevents inward compression of lock release tabs 174 (one of two labeled) when in the locked position.

Figure 3:
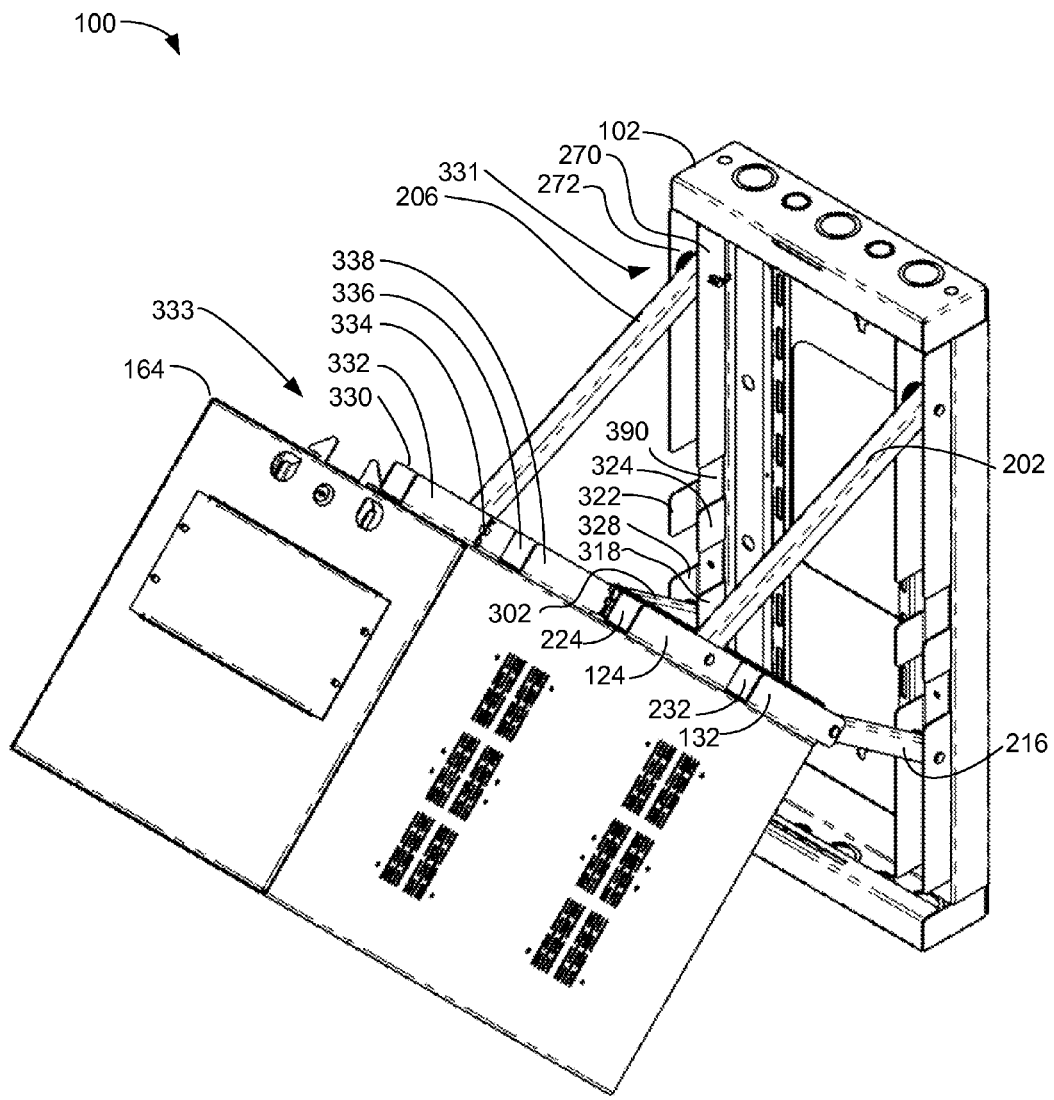
FIG. 3 is a top side perspective view illustrating the first exemplary embodiment of the wall-mounted articulating half-rack cabinet system of FIG. 1 in a partially (forty-five degrees) open configuration, according to a preferred embodiment of the present invention.

FIG. 3 is a top side perspective view illustrating the first exemplary embodiment of the wall-mounted articulating half-rack cabinet system 100 of FIG. 1 in a partially (forty-five degrees) open configuration, according to a preferred embodiment of the present invention. Left cabinet channel 333 is a third bar of the left four bar mechanism 331, 206, 333, 302 and includes left cabinet channel top outer flange 330, left cabinet channel top inner flange 332, left cabinet channel bottom outer flange 336, left cabinet channel bottom inner flange 338, and left cabinet channel base 490 (see FIG. 4), all of which are of one piece.

Figure 4:
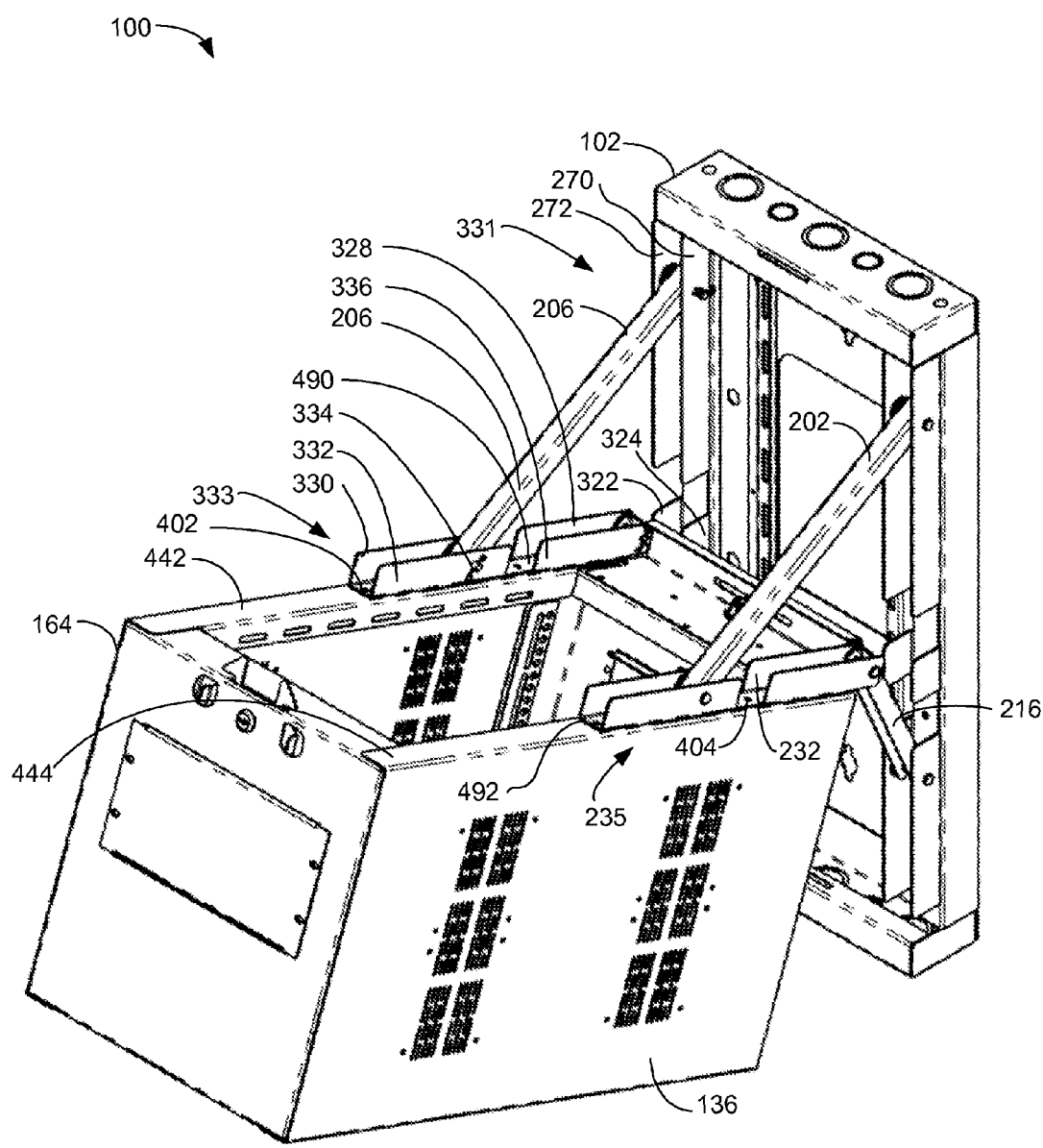
FIG. 4 is a top side perspective view illustrating the first exemplary embodiment of the wall-mounted articulating half-rack cabinet system of FIG. 1 in a partially (seventy-five degrees) open configuration, according to a preferred embodiment of the present invention.

Left mounting channel 331 is a first bar of the left four bar mechanism 331, 206, 333, 302 and can be seen to include top left mounting panel channel outer flange 272, top left mounting panel channel inner flange 270, middle left mounting panel channel outer flange 322, middle left mounting panel channel inner flange 324, bottom left mounting panel channel outer flange 328, bottom left mounting panel channel inner flange 318, and left mounting panel channel base 490 (see FIG. 4). Left mounting panel channel base 490 extends from the top edge of top left mounting panel channel outer flange 272 to the bottom edge of bottom left mounting panel channel outer flange 322 and is of one piece with top left mounting panel channel outer flange 272, top left mounting panel channel inner flange 270, middle left mounting panel channel outer flange 322, middle left mounting panel channel inner flange 324, bottom left mounting panel channel outer flange 328, and bottom left mounting panel channel inner flange 318. Left mounting channel 331 is fastened to a bent extension of left mounting side panel using a plurality of fasteners through left mounting panel channel base 490.

FIG. 4 is a top side perspective view illustrating the first exemplary embodiment of the wall-mounted articulating half-rack cabinet system 100 of FIG. 1 in a partially (seventy-five degrees) open configuration, according to a preferred embodiment of the present invention. Left cabinet channel 333 is fastened to a bent extension 442 of the left side panel of cabinet 100 with fasteners 402 (one of two visible labeled). Right cabinet channel 235 is fastened to a bent extension 444 of the right side panel 136 of cabinet 100 with fasteners 404 (one of two visible labeled). Left top bar 206 and left bottom bar 302 nest in left cabinet channel 333 which, in turn, nests in left mounting channel 331. Accordingly, left four bar mechanism 331, 206, 333, 302 is doubly nested.

Figure 5:
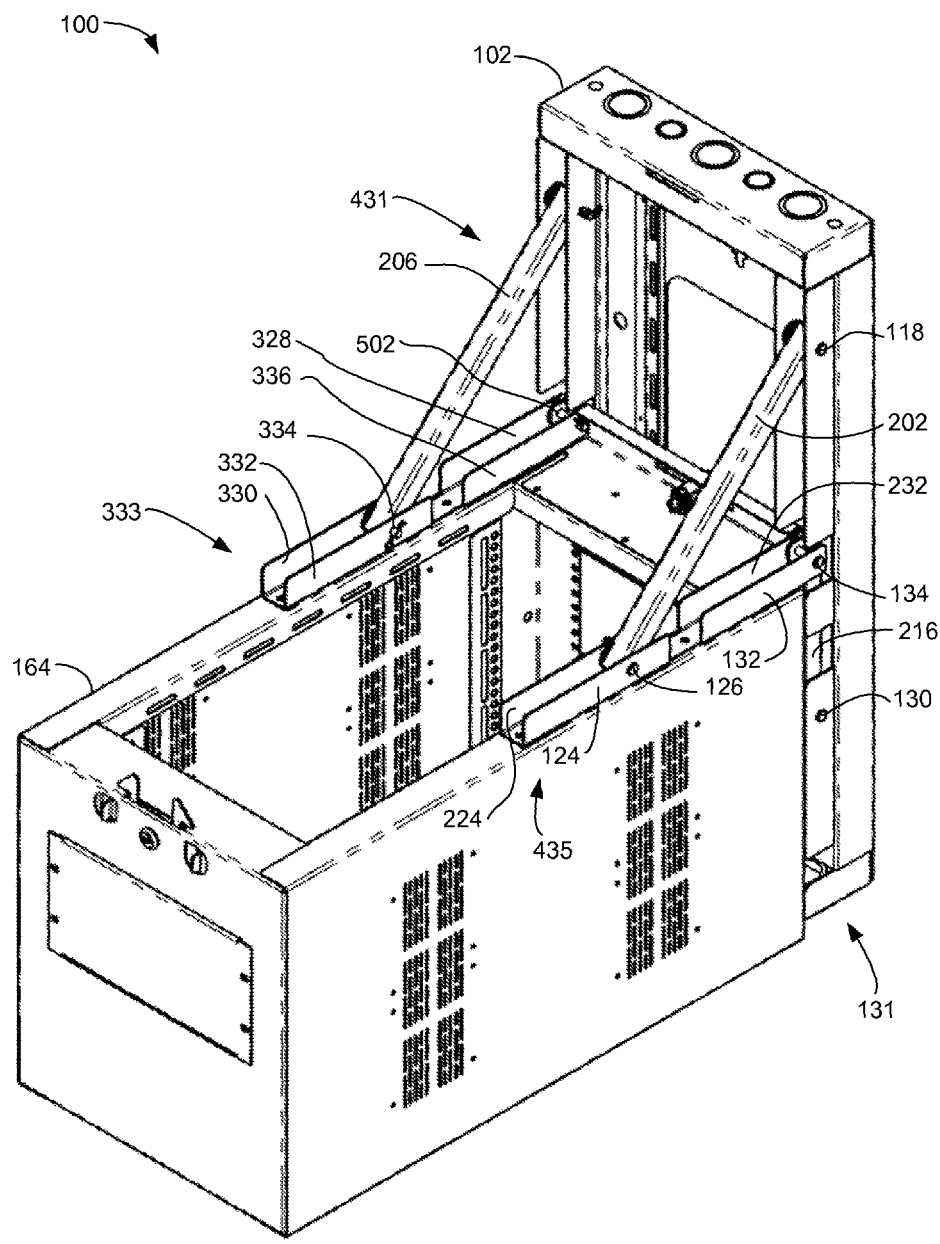
FIG. 5 is a top side perspective view illustrating the first exemplary embodiment of the wall-mounted articulating half-rack cabinet system of FIG. 1 in a completely (ninety degrees) open configuration, according to a preferred embodiment of the present invention.

FIG. 5 is a top side perspective view illustrating the first exemplary embodiment of the wall-mounted articulating half-rack cabinet system 100 of FIG. 1 in a completely (ninety degrees) open configuration, according to a preferred embodiment of the present invention. Top lower left bar pivot 502 can be seen in this view. The doubly nested right and left four bar mechanisms are similar. Note that the bottom right bar 216 is nested only in the right mounting channel 131 in this fully open configuration, with similar results on the left side. FIGS. 1-5 illustrate, in sequence, that the rotation of the half-rack cabinet 164 is not a rotation with respect to a fixed axis, relative to the wall mount 102.

Figure 6:
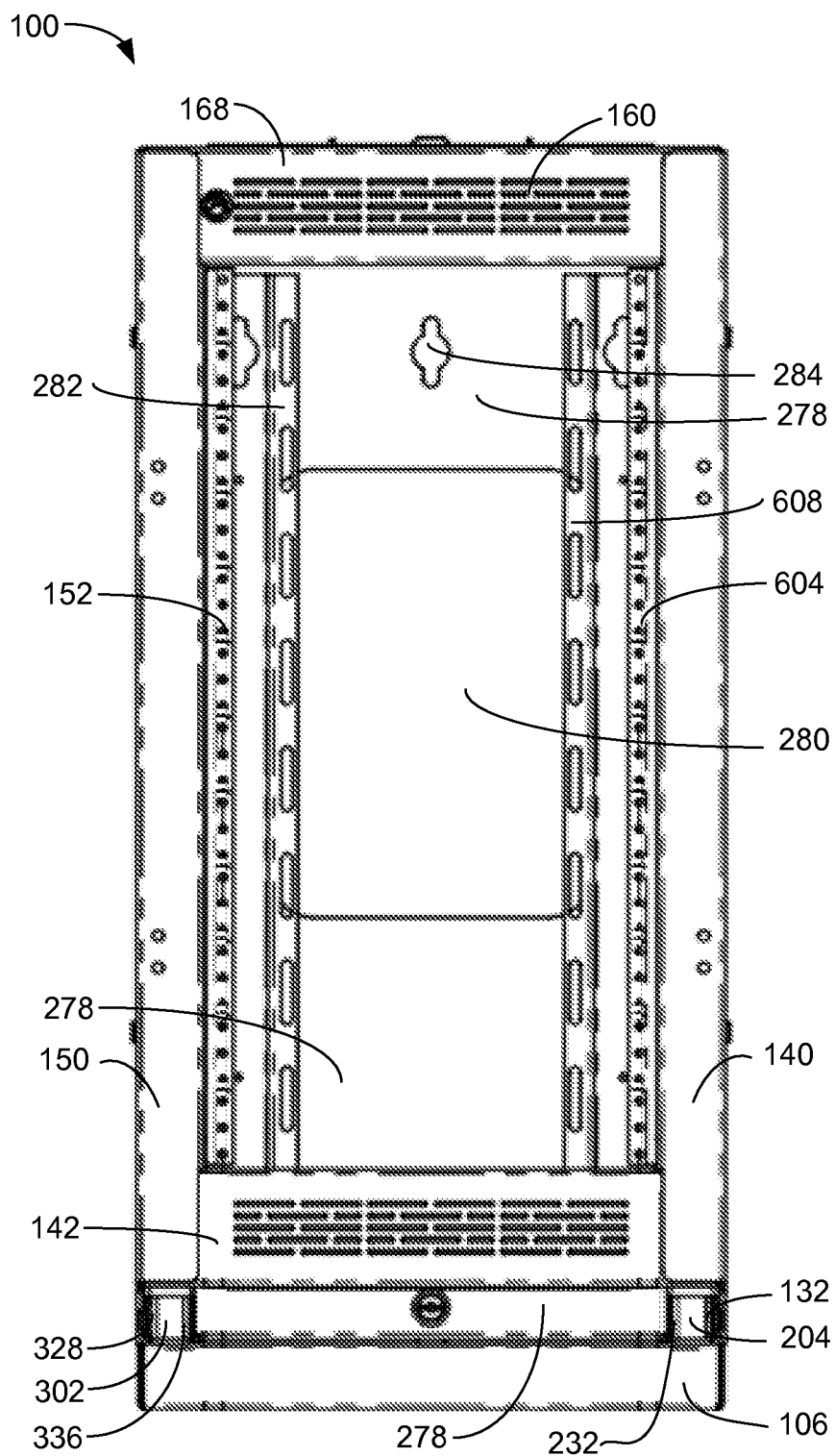
FIG. 6 is a front elevation view illustrating the first exemplary embodiment of the wall-mounted articulating half-rack cabinet system of FIG. 1, according to a preferred embodiment of the present invention.

FIG. 6 is a front elevation view illustrating the first exemplary embodiment of the wall-mounted articulating half-rack cabinet system 100 of FIG. 1, according to a preferred embodiment of the present invention. Left wall mount cable tie support 282 and right wall mount cable tie support 608 may be of various designs. Cables come into the wall mount 102 through punch outs 110, 112, 810, and 812 (see FIG. 8) and/or outlet opening 280 and are tied to left wall mount cable tie support 282 and right wall mount cable tie support 608, leaving enough slack for articulation of the cabinet 164. Left vertical attachment strip 152 and right vertical attachment strip 604 are parallel and spaced apart horizontally according to industry standards for receiving half-rack electronic modules.

Figure 7:
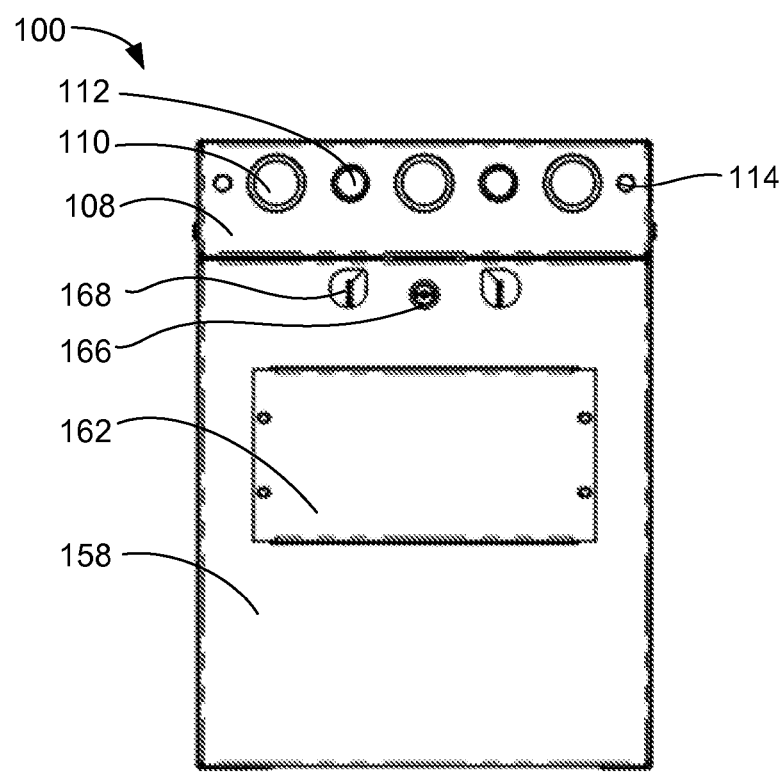
FIG. 7 is a top plan view illustrating the first exemplary embodiment of the wall-mounted articulating half-rack cabinet system of FIG. 1, according to a preferred embodiment of the present invention.

FIG. 7 is a top plan view illustrating the first exemplary embodiment of the wall-mounted articulating half-rack cabinet system 100 of FIG. 1, according to a preferred embodiment of the present invention. Top access panel 162 may be removed for additional ventilation or access.

Figure 8:
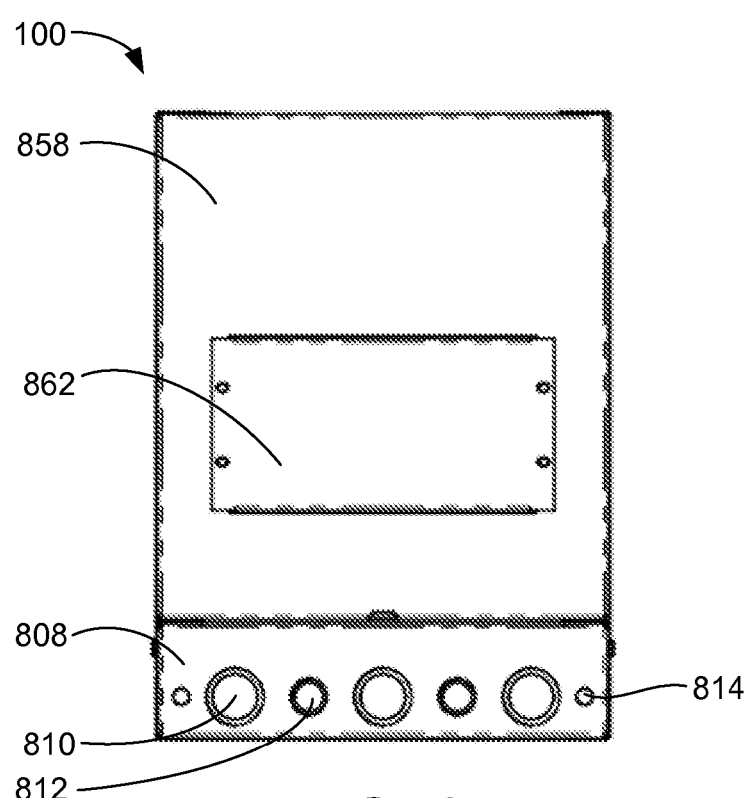
FIG. 8 is a bottom plan view illustrating the first exemplary embodiment of the wall-mounted articulating half-rack cabinet system of FIG. 1, according to a preferred embodiment of the present invention.

FIG. 8 is a bottom plan view illustrating the first exemplary embodiment of the wall-mounted articulating half-rack cabinet system 100 of FIG. 1, according to a preferred embodiment of the present invention. Bottom cabinet panel 858 includes releasably attached access panel 862. Bottom mounting panel 808 features large and small cable knock-outs 810 (one of three labeled) and 812 (one of two labeled), respectively. Fastener openings 814 (one of two labeled) assist in the construction of wall mount 102.

Figure 9:
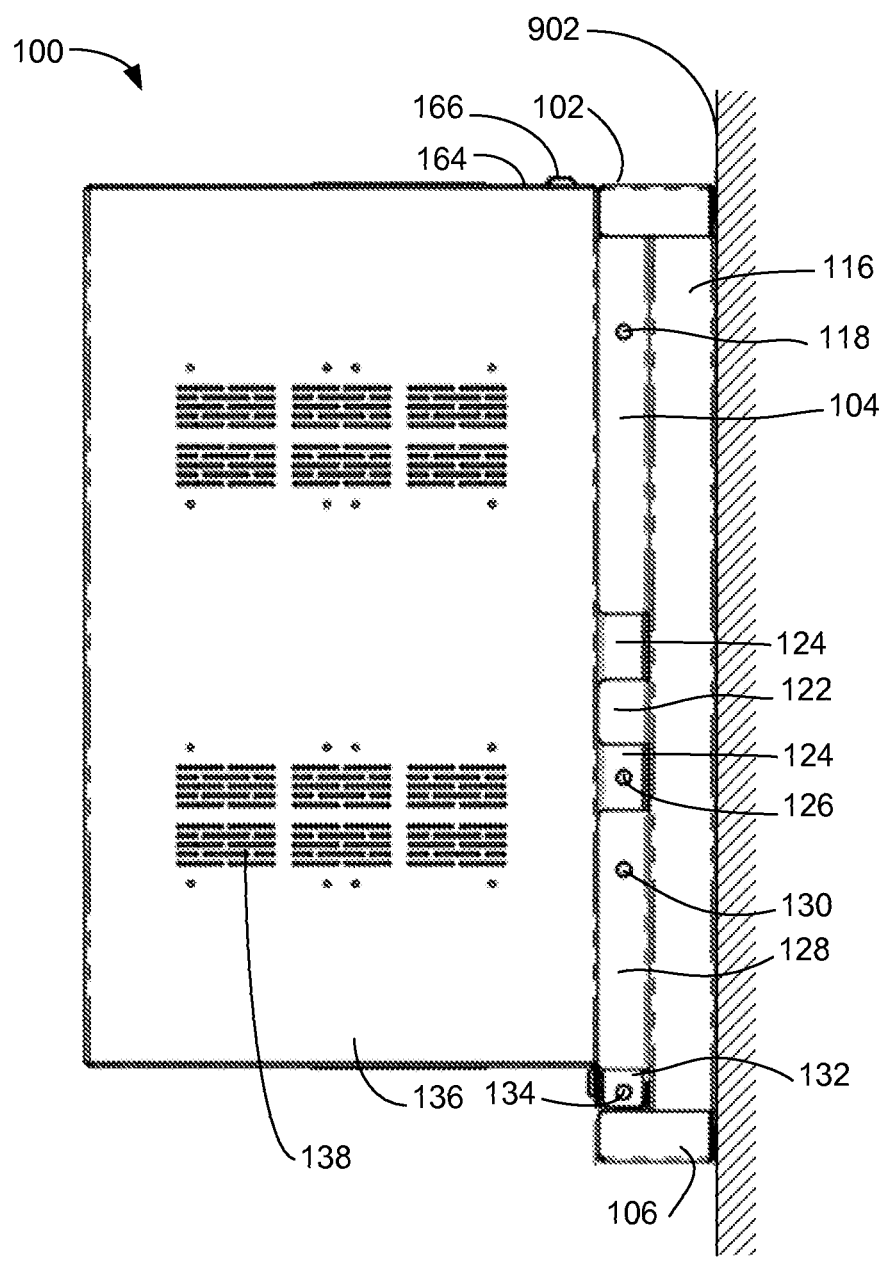
FIG. 9 is a side elevation view illustrating the first exemplary embodiment of the wall-mounted articulating half-rack cabinet system of FIG. 1, according to a preferred embodiment of the present invention.

FIG. 9 is a side elevation view illustrating the first exemplary embodiment of the wall-mounted articulating half-rack cabinet system 100 of FIG. 1, according to a preferred embodiment of the present invention. This right side view is a mirror image of the left side view. Wall mount 102 is attached to environmental surface 902. Attachment to the wall serves two purposes. First, wall mounting conserves floor space, especially by reuse. Second, any visual displays, such as indicator lights or video display panels, can be put at eye level for the user, making use easier and more convenient.

Figure 10:
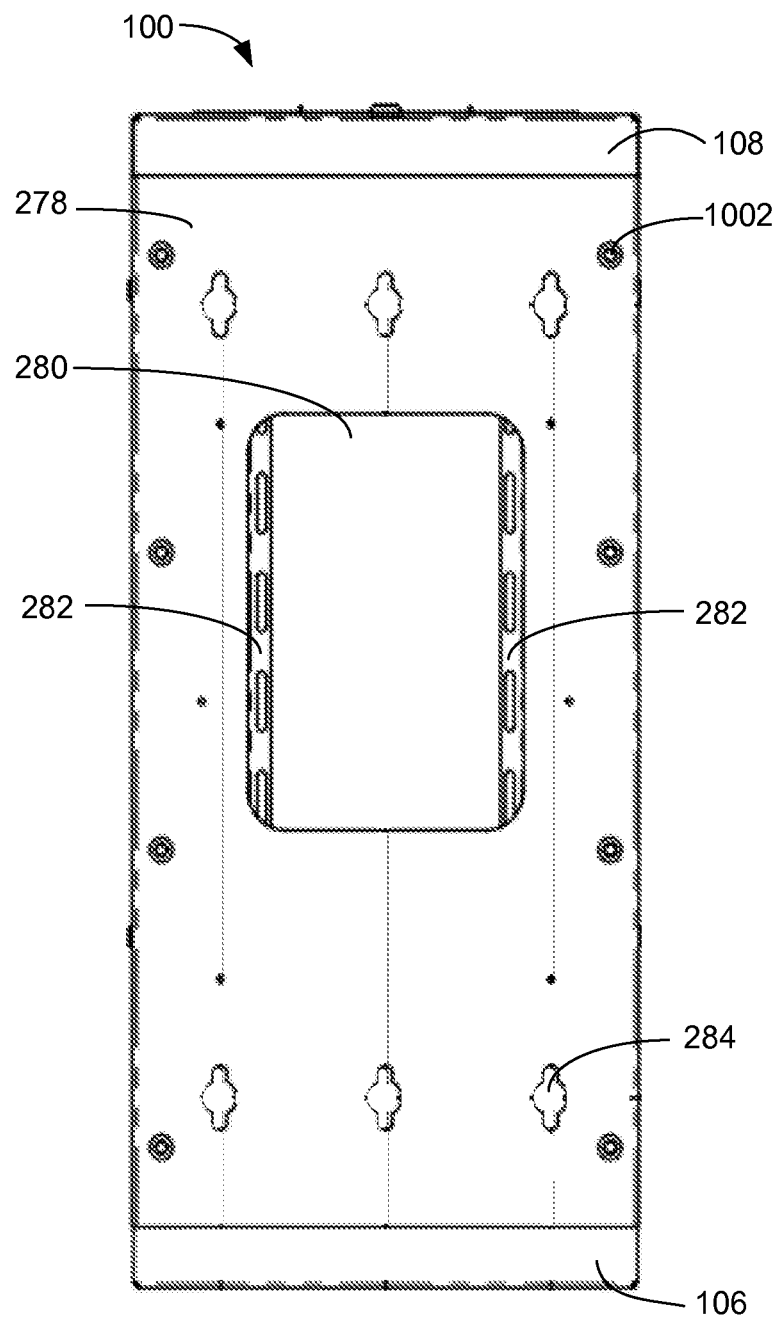
FIG. 10 is a rear elevation view illustrating the first exemplary embodiment of the wall-mounted articulating half-rack cabinet system of FIG. 1, according to a preferred embodiment of the present invention.

FIG. 10 is a rear elevation view illustrating the first exemplary embodiment of the wall-mounted articulating half-rack cabinet system 100 of FIG. 1, according to a preferred embodiment of the present invention. Wall mount rear panel 278 features a plurality of double key hole fastener openings 284 (one of six labeled) and an array of rubber feet 1002 (one of eight labeled). Outlet opening 280 is preferably sized to receive a wall outlet, such as for a high speed internet cable, which is conventionally routed through walls.

Figure 11:
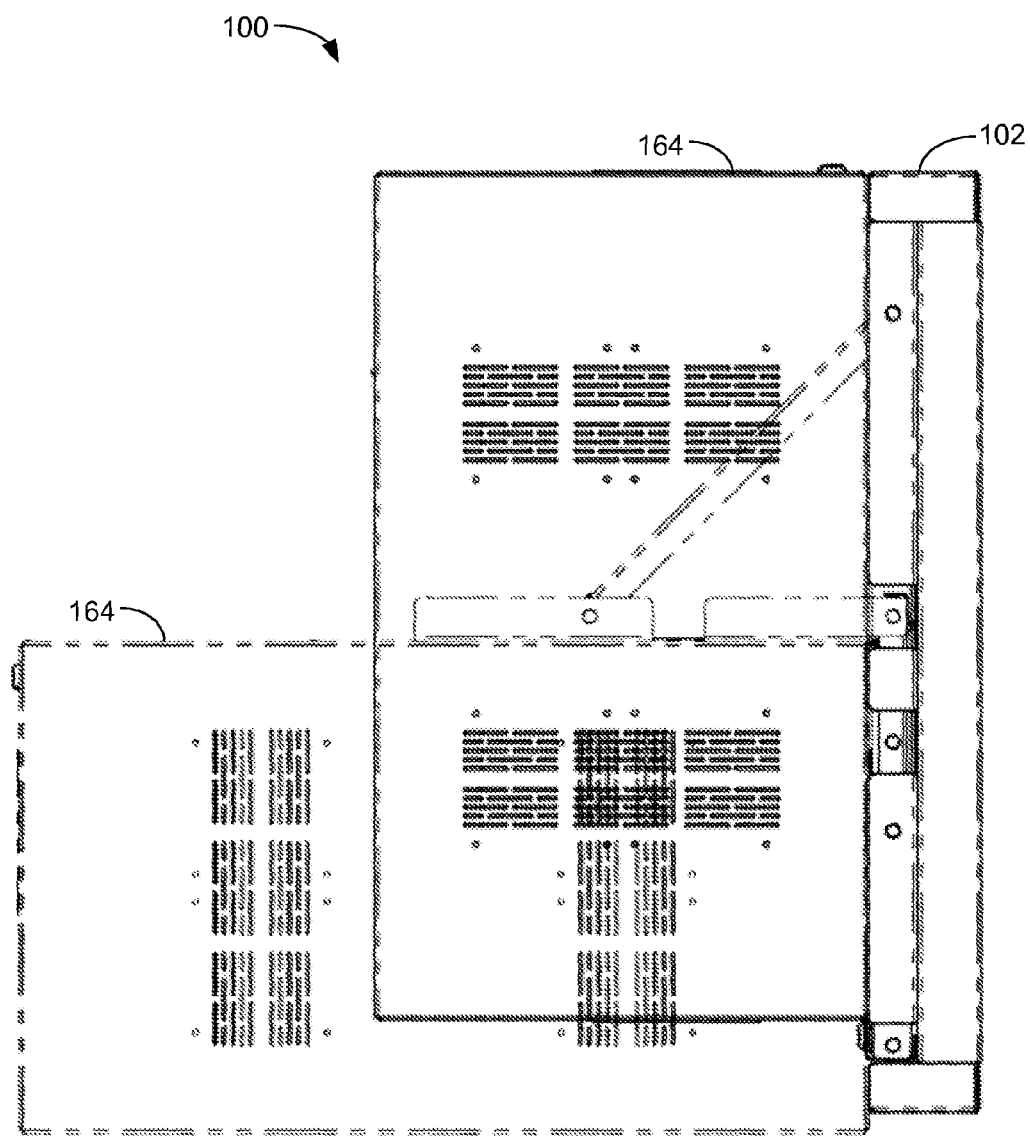
FIG. 11 is a side elevation view illustrating the first exemplary embodiment of the wall-mounted articulating half-rack cabinet system of FIG. 1, according to a preferred embodiment of the present invention.

FIG. 11 is a side elevation view illustrating the first exemplary embodiment of the wall-mounted articulating half-rack cabinet system 100 of FIG. 1, according to a preferred embodiment of the present invention. This side view illustrates the relationship between the closed and fully opened configurations of the wall-mounted articulating half-rack cabinet system 100.

Figure 12:
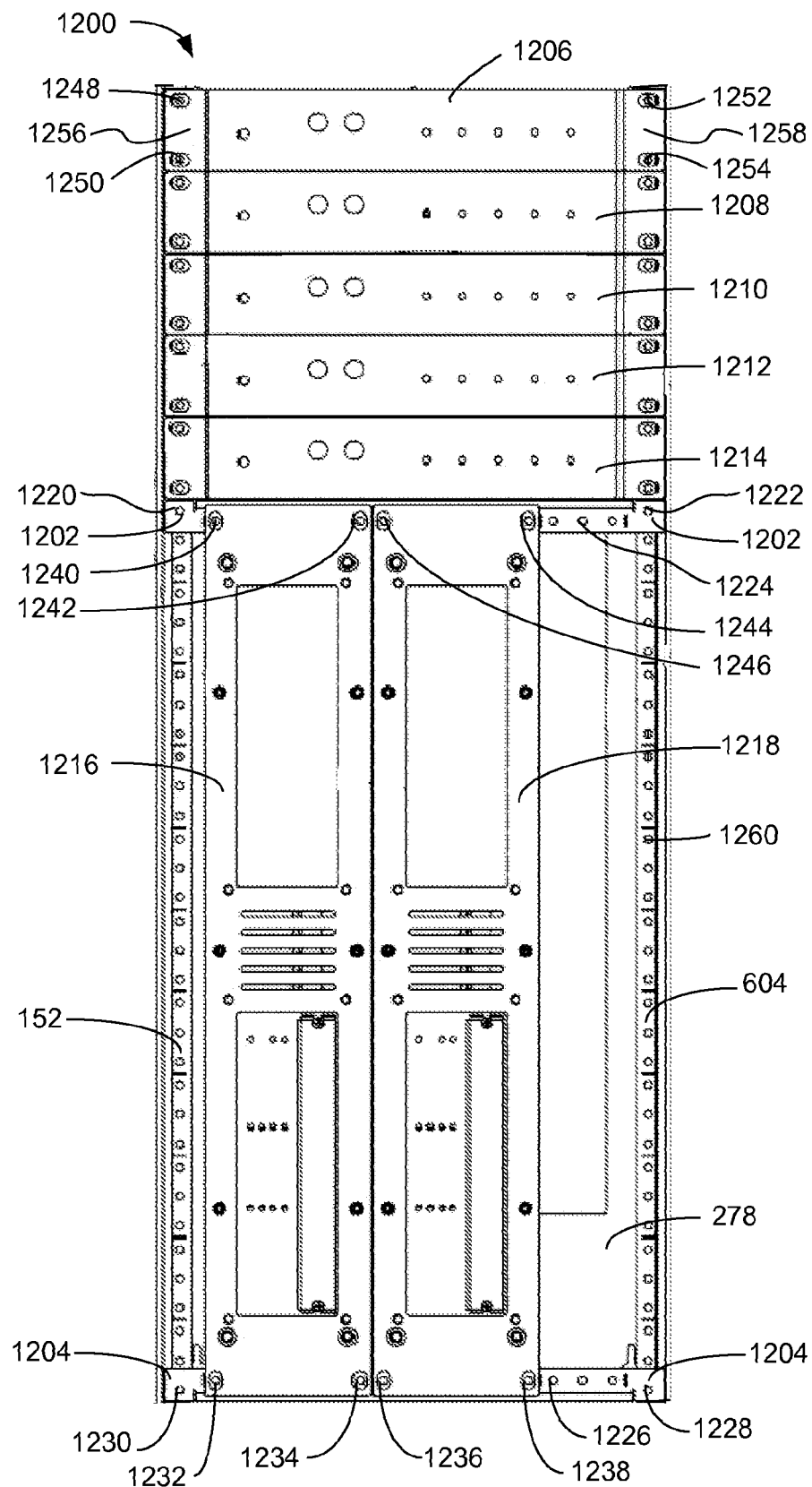
FIG. 12 is a front elevation view illustrating a second exemplary embodiment of the wall-mounted articulating half-rack cabinet system, according to a preferred embodiment of the present invention.

FIG. 12 is a front elevation view illustrating a second exemplary embodiment of the wall-mounted articulating half-rack cabinet system 1200, according to a preferred embodiment of the present invention. FIG. 12 illustrates the concurrent use of a plurality of half-rack modules 1206, 1208, 1210, 1212, and 1214 with a plurality of full-rack modules 1216 and 1218 in a half-rack cabinet 164. Only the internal parts of half-rack cabinet 164 are shown, for simplicity of illustration. The vertical attachment bars 152 and 604 of half-rack cabinet 164 are shown, as well as a portion of the wall mount rear panel 278. Half-rack module 1206 is secured in place by fasteners 1249 and 1250, and 1252 and 1254 through module flanges 1256 and 1258, respectively, into holes, such as hole 1260, in vertical attachment bars 152 and 604, respectively. Half-rack modules 1208, 1210, 1212, and 1214 are attached by similar means. Upper cross bar 1202 is attached by means of fasteners through holes 1220 and 1222 in upper cross bar 1202 and through holes, such as hole 1260, in vertical attachment bars 152 and 604, respectively. Lower cross bar 1204 is attached by means of fasteners through holes 1230 and 1228 in lower cross bar 1204 and through holes, such as hole 1260, in vertical attachment bars 152 and 604, respectively. First full rack module 1216 is attached to upper crossbar 1202 and lower crossbar 1204. Attachment is accomplished using fasteners 1240 and 1242 through holes, such as hole 1224, in upper crossbar 1202 and fasteners 1232 and 1234 through holes, such as hole 1226, in lower cross bar 1204. Second full rack module 1218 is attached to upper crossbar 1202 and lower crossbar 1204. Attachment is accomplished using fasteners 1244 and 1246 through holes, such as hole 1224, in upper crossbar 1202 and fasteners 1236 and 1238 through holes, such as hole 1226, in lower cross bar 1204.

Various arrangements of full-rack modules 1216 and 1218 along with half-rack modules 1206, 1208, 1210, 1212, and 1214 are contemplated. For example, if the full-rack modules 1216 and 1218 produce most of the heat in the assembly, they may be put at the top, with the half-rack modules 1206, 1208, 1210, 1212, and 1214 on the bottom. For another example, the full-rack modules 1216 and 1218 may be spaced apart horizontally instead of being adjacent, as shown. For yet another example, the full-rack modules 1216 and 1218 may be in the middle, with half-rack modules 1206, 1208, 1210, 1212, and 1214 above and below.

A requirement for wall-mounted articulating half-rack cabinet system 1200 is that the cabinet 164 be tall enough to accommodate the full-rack and half-rack modules 1216, 1218, 1206, 1208, 1210, 1212, and 1214 together. In various additional embodiments, cabinet 164 may be sized for more or fewer half-rack modules 1206, 1208, 1210, 1212, and 1214 and/or for more full-rack modules 1216 and 1218.

Crossbars 1202 and 1204 may be used in any half-rack cabinet of sufficient height, whether wall-mounted or not.

Figure 13:
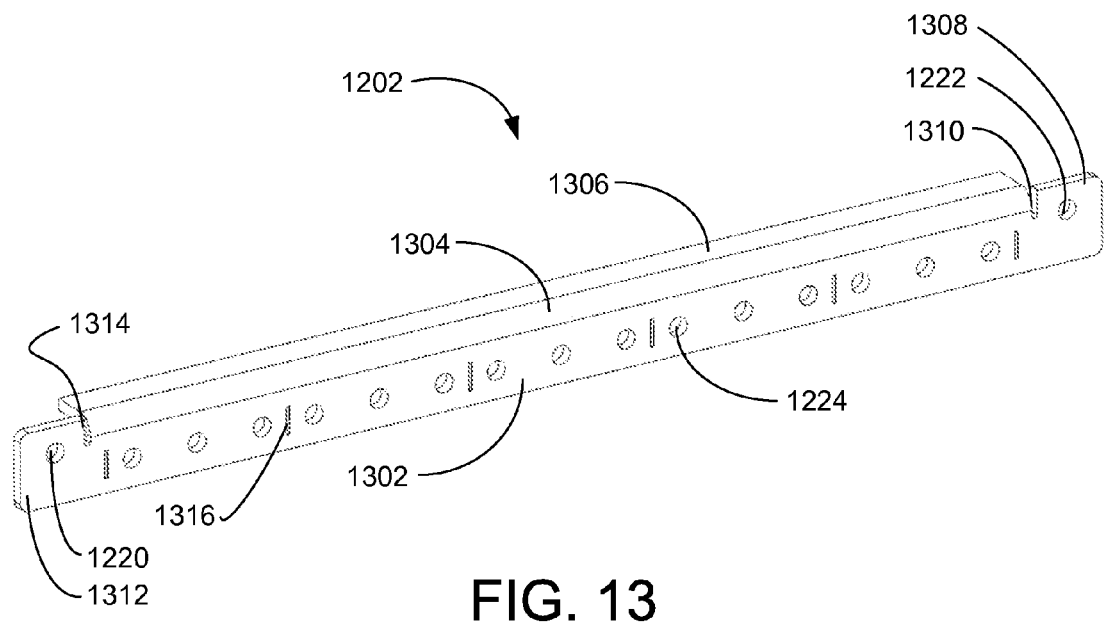
FIG. 13 is a front-top perspective view of an exemplary embodiment of a crossbar of the second exemplary embodiment of the exemplary wall-mounted articulating half-rack cabinet system of FIG. 12, according to a preferred embodiment of the present invention.

FIG. 13 is a front-top perspective view of an exemplary embodiment of a crossbar 1202 of the second exemplary embodiment of the exemplary wall-mounted articulating half-rack cabinet system 1200 of FIG. 12, according to a preferred embodiment of the present invention. Crossbar 1202 has an elongated flat front panel 1302 which extends at left and right ends into coupling flanges 1312 and 1308, respectively. Coupling flange 1308 is partially separated from flat front panel 1302 by notch 1310 and includes fastener-receiving hole 1222 for assisting in fastening crossbar 1202 to vertical attachment strip 604 (see FIG. 6). Coupling flange 1312 is partially separated from flat front panel 1302 by notch 1314 and includes fastener-receiving hole 1220 for assisting in fastening crossbar 1202 to vertical attachment strip 152 (see FIG. 6). Flat front panel 1302 has a plurality of holes 1224 (one of fifteen labeled) for receiving fasteners for assisting in fastening full-rack modules 1216 and 1218 to crossbar 1202. Flat front panel 1302 also has a plurality of grooves 1316 (one of six labeled) which separate holes 1224 into groups of three. Flat front panel 1302 extends along its top edge through a bend 1304 to a flange 1306. Flange 1306 improves the rigidity of flat front panel 1302.

Figure 14:
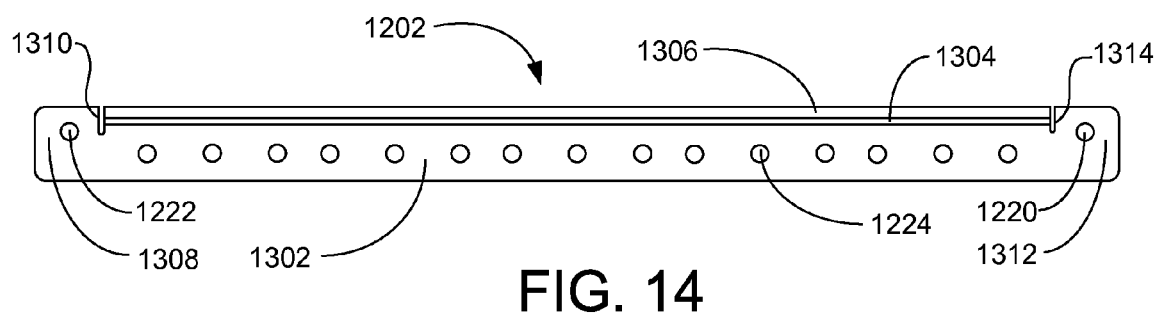
FIG. 14 is a rear elevation view of an exemplary embodiment of the crossbar of the second exemplary embodiment of the exemplary wall-mounted articulating half-rack cabinet system of FIG. 12, according to a preferred embodiment of the present invention.

FIG. 14 is a rear elevation view of an exemplary embodiment of the crossbar 1202 of the second exemplary embodiment of the exemplary wall-mounted articulating half-rack cabinet system 1200 of FIG. 12, according to a preferred embodiment of the present invention. The depth of notches 1310 and 1314 can be more clearly seen in this view. Crossbar 1204 is similar to crossbar 1202.

Figure 15:
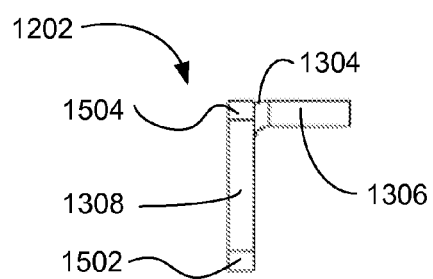
FIG. 15 is an end elevation view of an exemplary embodiment of the crossbar of the second exemplary embodiment of the exemplary wall-mounted articulating half-rack cabinet system of FIG. 12, according to a preferred embodiment of the present invention.

FIG. 15 is an end elevation view of an exemplary embodiment of the crossbar 1202 of the second exemplary embodiment of the exemplary wall-mounted articulating half-rack cabinet system 1200 of FIG. 12, according to a preferred embodiment of the present invention. Rounded corners 1502 and 1504 on coupling flange 1308 are preferred. Coupling flange 1312 is similar to coupling flange 1308.

Those of ordinary skill in the art, enlightened by the present disclosure, will appreciate that mere variations in size will enable the wall-mounted, doubly-nested four bar mechanism to be used with variously sized racks and cabinets in the electronics industry, including full-width (nineteen inches) racks. In addition, those of ordinary skill in the art, enlightened by the present disclosure, will appreciate that applications for the present invention extend beyond the electronics industry.

The embodiments presented herein are exemplary and are not intended to be limiting within the bounds of enablement provided in the specification and the legal boundaries in the claims below. Various substitutions of materials, variation in size, and changes in design that are not dysfunctional for the system claimed are within the scope of the invention.

We claim:

1. A wall-mounted articulating half-rack cabinet system, comprising:
   a. a wall mount;
   b. a half-rack cabinet having a width adapted to receive and mount half-rack-sized electronics modules; and
   c. first and second four-bar mechanisms coupling said wall mount to said half-rack cabinet and adapted to rotate said half-rack cabinet about a non-fixed axis of rotation relative to said wall mount;
   d. wherein each four-bar mechanism of said first and second four-bar mechanisms comprises:
      i. a first bar that is a first U-shaped channel fixed to said wall mount;
      ii. a second bar pivotably coupled to said first bar via a first pivotable coupling;
      iii. a third bar that is a second U-shaped channel fixed to said half-rack cabinet and pivotably coupled to said second bar via a second pivotable coupling; and
      iv. a fourth bar pivotable coupled to said third bar via a third pivotable coupling and to said first bar via a fourth pivotable coupling.

2. The system of claim 1, wherein said wall mount comprises:
   a. a top mounting panel;
   b. left and right side panels extending from said top mounting panel having first and second inwardly bent extensions, respectively, forming first and second forward-facing panels, respectively;
   c. a bottom mounting panel fixedly engaging distal ends of said left and right side panels; and
   d. a back panel extending between said left and right side panels and between said top and bottom mounting panels.

3. The system of claim 2, wherein said first U-shaped channels of said first and second four-bar mechanisms are fixed to said first and second forward-facing panels, respectively, of said wall mount.

4. The system of claim 1, wherein said half-rack cabinet comprises internal opposed and horizontally aligned first and second vertical attachment bars, each having a plurality of spaced apart holes, wherein said first and second vertical attachment bars are each configured to be longer than the combined length of a width of a full-rack-sized electronic module plus the height of at least one half-rack-sized electronic module.

5. The system of claim 4, further comprising:
   a. first and second side-to-side crossbars each having first and second coupling flanges at opposed ends of each said crossbar of said first and second side-to-side crossbars;
   b. first and second fastener openings in said first and second coupling flanges are spaced apart to align with said spaced apart holes in internal opposed and horizontally aligned first and second vertical attachment bars; and
   c. wherein said first and second side-to-side crossbars comprise holes adapted for receiving fasteners configured to assist in mounting a full-rack-sized electronic module in a vertical orientation between said first and second side-to-side crossbars.

6. The system of claim 1, wherein said first and second four-bar mechanisms are spaced apart and parallel.

7. The system of claim 1, wherein said first and second four-bar mechanisms are operable to articulate said half-rack cabinet into an orientation having between a zero degree angle and a ninety-degree angle, inclusive, with respect to said wall mount.

8. The system of claim 1, wherein said wall mount is not wider than said half-rack cabinet.

9. The system of claim 1, wherein each four-bar mechanism of said first and second four-bar mechanisms comprises steel.

10. The system of claim 1, comprising:
    a. said second bar sized to nest in said third bar when said half-rack cabinet is closed to said wall mount; and
    b. said third bar sized to nest within said first bar when said half-rack cabinet is closed to said wall mount.

11. The system of claim 1, comprising first and second spaced apart inner side flanges and first and second spaced apart outer side flanges of said second U-shaped channel.

12. The system of claim 1, wherein only said wall mount comprises a plurality of cable knockouts.

13. A wall-mounted articulating half-rack cabinet system, comprising:
    a. a wall mount;
    b. a half-rack cabinet;
    c. first and second four-bar mechanisms coupling said wall mount to said half-rack cabinet, wherein said first and second four-bar mechanisms are spaced apart and parallel and are operable to articulate said half-rack cabinet into orientations between zero and ninety-degrees of angle about a non-fixed horizontal axis of rotation with respect to said wall mount; and
    d. wherein each four-bar mechanism of said first and second four-bar mechanisms comprises:
       i. a first bar that is a first U-shaped channel fixed to said wall mount;
       ii. a second bar pivotably coupled to said first bar via a first pivotable coupling;
       iii. a third bar that is a second U-shaped channel fixed to said half-rack cabinet and pivotably coupled to said second bar via a second pivotable coupling; and
       iv. a fourth bar pivotably coupled to said third bar via a third pivotable coupling and to said first bar via a fourth pivotable coupling.

14. The system of claim 13, wherein each four-bar mechanism of said first and second four-bar mechanisms comprises steel.

15. The system of claim 13, comprising:
    a. said second bar sized to nest in said third bar when said half-rack cabinet is closed to said wall mount; and
    b. said third bar sized to nest within said first bar when said half-rack cabinet is closed to said wall mount.

16. The system of claim 13, comprising openings in side flanges of said first and second U-shaped channels to accommodate said pivotable couplings.

17. The system of claim 13, comprising a plurality of cable knockouts only through said wall mount.

18. The system of claim 13, wherein said half-rack cabinet comprises:
    a. internal opposed and horizontally aligned first and second vertical attachment bars, each having a plurality of spaced apart holes, wherein said first and second vertical attachment bars are each configured to be longer than the combined lengths of a width of a full-rack-sized electronic module plus the height of at least one half-rack-sized electronic module;
    b. first and second crossbars each having:
       i. first and second coupling flanges at opposed ends of each crossbar of said first and second crossbars;

ii. first and second fastener openings in said first and second coupling flanges spaced apart to align with said spaced apart holes in said internal opposed and horizontally aligned first and second vertical attachment bars; and c. wherein said first and second crossbars comprise holes spaced apart for receiving fasteners configured to assist in mounting a full-rack-sized electronic module in a vertical orientation between said first and second crossbars.

19. A wall-mounted articulating half-rack cabinet system, comprising:
   a. a wall mount having a plurality of fastener openings adapted for assisting in fastening said wall mount to a wall;
   b. a half-rack cabinet no wider than said wall mount and comprising internal spaced-apart parallel vertical attachment bars adapted for mounting a plurality of half-rack modules;
   c. first and second doubly-nested spaced apart and parallel four-bar mechanisms coupling said wall mount to said half-rack cabinet and operable to articulate said half-rack cabinet into orientations between zero and ninety-degrees of angle about a non-fixed horizontal axis of rotation with respect to said wall mount;
   d. wherein each four-bar mechanism of said first and second four-bar mechanisms comprises:
      i. a first bar that is a first U-shaped channel fixed to said wall mount;
      ii. a second bar pivotably coupled to said first bar via a first pivotable coupling;
      iii. a third bar that is a second U-shaped channel fixed to said half-rack cabinet and pivotably coupled to said second bar via a second pivotable coupling; and
      iv. a fourth bar pivotably coupled to said third bar and to said first bar via a third pivotable coupling and to said first bar via a fourth pivotable coupling; and
   e. wherein:
      i. said second bar sized to nest in said third bar when said half-rack cabinet is closed to said wall mount; and
      ii. said third bar sized to nest within said first bar when said half-rack cabinet is closed to said wall mount.

20. The system of claim 13, wherein said half-rack cabinet comprises:
   a. internal opposed and horizontally aligned first and second vertical attachment bars, wherein said first and second vertical attachment bars are each configured to be longer than the combined lengths of a width of a full-rack-sized electronic module plus the height of at least one half-rack-sized electronic module;
   b. first and second crossbars each having:
      i. first and second coupling flanges at opposed ends of each crossbar of said first and second crossbars;
      ii. first and second fastener openings in said first and second coupling flanges, respectively, adapted for assisting in attaching said first and second crossbars horizontally to said internal opposed and horizontally aligned first and second vertical attachment bars during installation, in a parallel configuration and spaced-apart to receive a full-rack-sized electronic module; and
   c. wherein said first and second crossbars comprise holes adapted for receiving fasteners configured to assist in mounting a full-rack-sized electronic module in a vertical orientation between said first and second crossbars, when said first and second crossbars are installed.

* * * * *